(12) United States Patent
Mitani

(10) Patent No.: US 6,885,588 B2
(45) Date of Patent: Apr. 26, 2005

(54) NONVOLATILE SEMICONDUCTOR MEMORY DEVICE

(75) Inventor: Hidenori Mitani, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/684,501

(22) Filed: Oct. 15, 2003

(65) Prior Publication Data

US 2004/0125657 A1 Jul. 1, 2004

(30) Foreign Application Priority Data

Dec. 27, 2002 (JP) ................................. P2002-379260

(51) Int. Cl.$^7$ .............................................. G11C 16/04
(52) U.S. Cl. .......................... 365/185.18; 365/18.22; 365/185.29; 365/189.09
(58) Field of Search .............. 365/185.18, 185.22, 365/185.29, 189.09, 218

(56) References Cited

U.S. PATENT DOCUMENTS 6,590,813 B1 * 7/2003 Shiga ..................... 365/189.09
6,751,118 B1 * 6/2004 Tran et al. ............. 365/185.03

FOREIGN PATENT DOCUMENTS

JP          2000-105694        4/2000

* cited by examiner

*Primary Examiner*—Son T. Dinh
(74) *Attorney, Agent, or Firm*—McDermott Will & Emery LLP

(57) ABSTRACT

A nonvolatile semiconductor memory device includes a memory array, a selecting circuit, a storage device, a power generator, a connecting circuit, and a write or erase controller. The selecting circuit selects one of memory cells from the memory array. A sequence for controlling write and erase operations for the memory cells is stored in the storage device. The power generator is able to generate certain voltage higher than requirement voltage for write or erase operation. The sequence includes a plurality of sub-sequences in which write or erase operation to the memory cell is implemented. Each of the sub-sequences includes before the end: a voltage resetting step of resetting a voltage impressed on the selecting circuit to the power voltage or grounding; and a route resetting step of resetting a switch of a transistor of the selecting circuit to last status just before write or erase operation.

5 Claims, 6 Drawing Sheets

Fig.4

| bit7 | bit6 | bit5 | bit4 | bit3 | bit2 | bit1 | bit0 |
|---|---|---|---|---|---|---|---|
| SKIP SEQUENCE 8 | SKIP SEQUENCE 7 | SKIP SEQUENCE 6 | SKIP SEQUENCE 5 | SKIP SEQUENCE 4 | SKIP SEQUENCE 3 | SKIP SEQUENCE 2 | SKIP SEQUENCE 1 |

NONVOLATILE SEMICONDUCTOR MEMORY DEVICE

BACKGROUND OF THE INVENTION

1. Field of the Invention

The present invention relates to a nonvolatile semiconductor memory device and a write/erase control sequence thereof.

2. Description of the Background Art

A flash memory is known as a nonvolatile semiconductor memory device. The flash memory has a memory array in which memory cells are two-dimensionally arranged, and a controller (CPU) for controlling write and erase operations. The flash memory stores a sequence (program) serving as software for controlling write and erase operations therein.

In a prior art flash memory, a plurality of flag areas are formed when a rewrite program is written in the flash memory. The flash memory has a controller which performs decisions of the ends of a plurality of steps of the rewrite process or decisions of true and false of the steps to record the results in the flag areas, respectively (Japanese Laid-open Patent Publication No. 2000-105694).

Of a write operation and an erase operation of a flash memory, the erase operation has a complex sequence. Although one erase operation for the sequence requires several seconds in a practical device, execution of the simulation (verification) may require several tens of hours. However, when the simulation time becomes long, the sequence may be interrupted along the way. For example, a defect may be detected in the middle of the sequence, and the execute of the sequence may be interrupted along the way due to the simulation tool. Even though the simulation is completed in the first half of the sequence, the long sequence must be continuously executed from the first to the end again to perform the simulation of the second half. In this case, even though the sequence is executed from the middle of the sequence by jumping over the first half, the state of the sequence part skipped by the jump is not matched with the state of the second half of the sequence, and accurate simulation cannot be performed with good matching as a whole. In this manner, the elongation of the simulation time is one of factors which extend development periods.

SUMMARY OF THE INVENTION

It is an object of the present invention to provide a nonvolatile semiconductor memory device which can efficiently perform verification of a sequence for write and erase control.

In accordance with one aspect of the present invention, there is provided a nonvolatile semiconductor memory device includes a memory array, a selecting circuit, a storage device, a power generator, a connecting circuit, and a write or erase controller. A plurality of memory cells are two-dimensionally arranged in the memory array. The selecting circuit selects one of memory cells from the memory array. A sequence for controlling write and erase operations for the memory cells is stored in the storage device. A sequence for controlling write and erase operations for the memory cells is stored in the storage device. The power generator is able to generate certain voltage higher than requirement voltage for write or erase operation. The connecting circuit connects the selecting circuit with the power generator. The write or erase controller for reading the sequence from the storage unit controls the write and erase operations for the memory cells. The sequence includes a plurality of sub-sequences in which write or erase operation to the memory cell is implemented. Each of the sub-sequences includes before the end: a voltage resetting step of resetting a voltage impressed on the selecting circuit to the power voltage or grounding; and a route resetting step of resetting a switch of a transistor of the selecting circuit to last status just before write or erase operation.

BRIEF DESCRIPTION OF THE DRAWINGS

The present invention will become readily understood from the following description of preferred embodiments thereof made with reference to the accompanying drawings, in which like parts are designated by like reference numeral and in which:

FIG. 4 is a diagram of the outline of a register in which flags for checking whether the sub-sequences are skipped or not are stored;

DETAILED DESCRIPTION OF PREFERRED EMBODIMENTS

Figure 1:
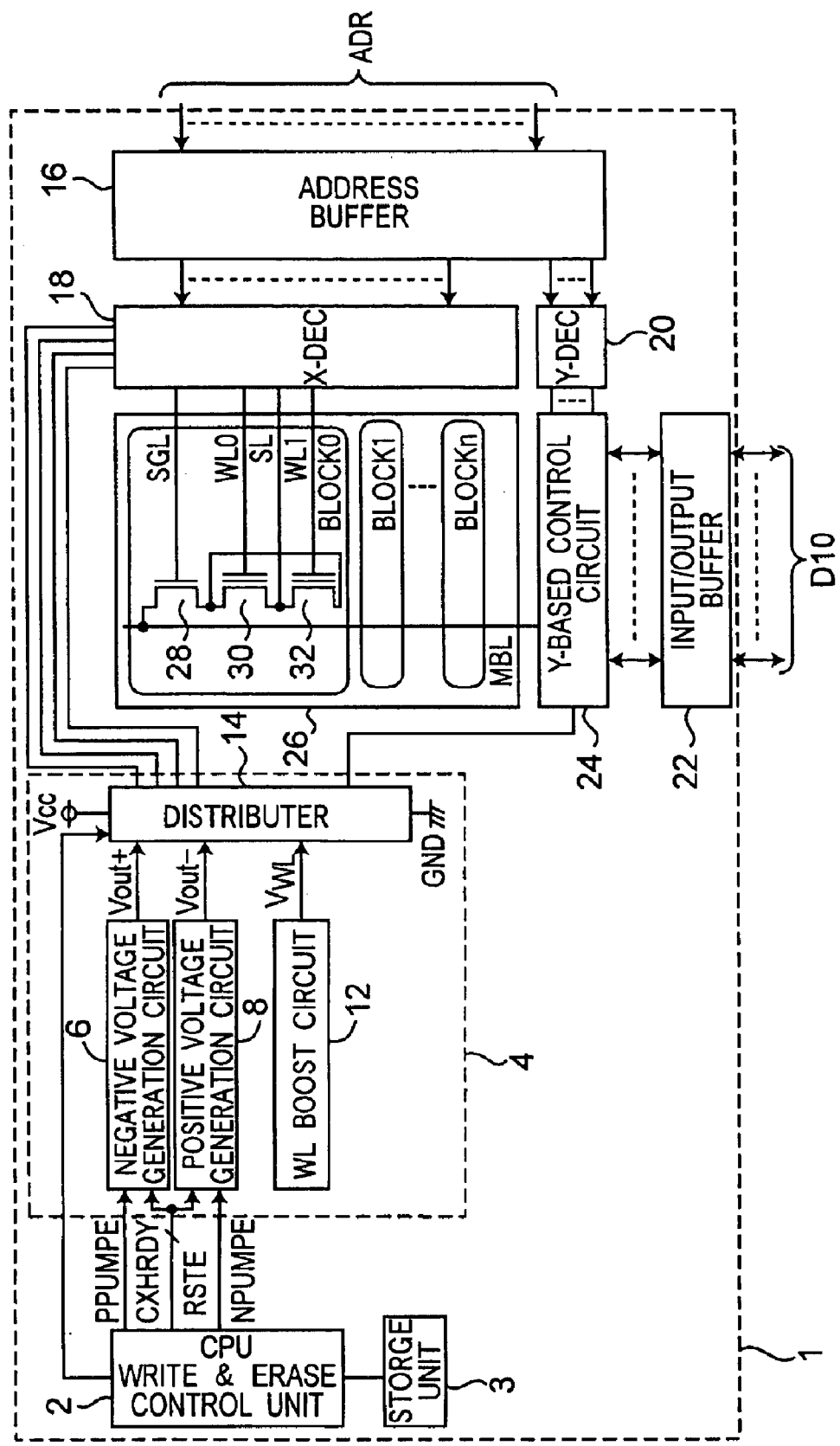
FIG. 1 is a block diagram of a schematic configuration of a nonvolatile semiconductor memory device according to a first embodiment of the present invention.

Nonvolatile semiconductor memory devices according to the embodiments of the present invention will be described below with reference to the accompanying drawings. The same reference numerals as in the drawings denote the same parts in the drawings.

First Embodiment

A nonvolatile semiconductor memory device according to the first embodiment of the present invention will be described with reference to FIG. 1 which is a block diagram of a schematic configuration of a nonvolatile semiconductor memory device 1. The nonvolatile semiconductor memory device 1 is a flash memory which has a memory array 26 in which a plurality of memory cells 30 and 31 are two-dimensionally arranged, a storage unit 3 which stores a sequence of a program code for executing write and erase operations for memory cells 30 and 31, and a write/erase controller (control unit) 2 for reading the sequence from the storage unit 3 and for performing writing and erasing operations for the memory cells on the basis of the sequence. The storage unit 3 may be read-only memory (hereinafter referred to as ROM), random-access memory (hereinafter referred to as RAM), or the like.

The nonvolatile semiconductor memory device 1 further has:

(A) a voltage generator 4 which receives a standby signal CXHRDY, a charge pump activating signal PPUMPE, and a reset signal RSET from the write/erase controller 2 to generate and output output voltages Vout+, Vout−, and VWL depending on these signals;

(B) an address buffer 16 which receives an address signal ADR from the outside;

(C) an X decoder 18 which receives an internal address signal from the address buffer 16 and a voltage from the voltage generator 4 to determine the voltages of a select gate line SGL, word lines WL0 and WL1, a source line SL, and a well;

(D) an input/output buffer to give and receive a data input/output signal DIO;

(E) a Y decoder 20 which receives an address signal from the address buffer 16 to decode the address signal; and (F) a Y-based controller 24 which applies a high voltage to a main bit line MBL in response to a data input/output signal depending on an output signal from the Y decoder 20.

The voltage generator 4 includes: a positive voltage generator 6 for generating an output voltage Vout+; a negative voltage generator 8 for generating an output voltage Vout−; a WL booster 12 for generating a word line voltage VWL; and a distributer 14, controlled by the write/erase controller 2, for receiving the output voltages Vout+ and Vout− and the word line voltage VWL to distribute these voltages to the respective internal circuits. The WL booster 12 is a circuit for generating a boost voltage applied to a word line WL selected in a read state to realize high-speed access and the selected select gate SG.

The X decoder 18 includes: a WL decoder (not shown) for selecting a word line; an SG decoder (not shown) for selecting a select gate; and a WELL decoder (not shown) for selecting a well area corresponding to a selected memory block and an SL decoder (not shown) for selecting a source line.

The Y-based controller 24 includes: a YG & sense amplifier and a latch circuit (not shown) for performing column selection in a read state to cause a sense amplifier to perform a read operation; and a page buffer (not shown) for checking on the basis of latched data whether a high voltage is applied to a main bit line MBL in a write state or not.

The nonvolatile semiconductor memory device 1 includes the memory array 26. The memory array 26 includes memory blocks BLOCK0 to BLOCKn formed inside separated wells. For example, the memory block BLOCK0 includes memory cells 30 and 32 and a select gate 28. In the memory block BLOCK0, memory cells corresponding to the select gate line SGL, the word lines WL0 and WL1, and the source line SL selected by the X decoder 18, and data is stored in response to a signal corresponding to the data from the main bit line MBL. In FIG. 1, the select gate 28 and the memory cells 30 and 32 corresponding to the selected select gate line SGL, the word lines WL0 and WL1, and the source line SL are typically illustrated.

Figure 2:
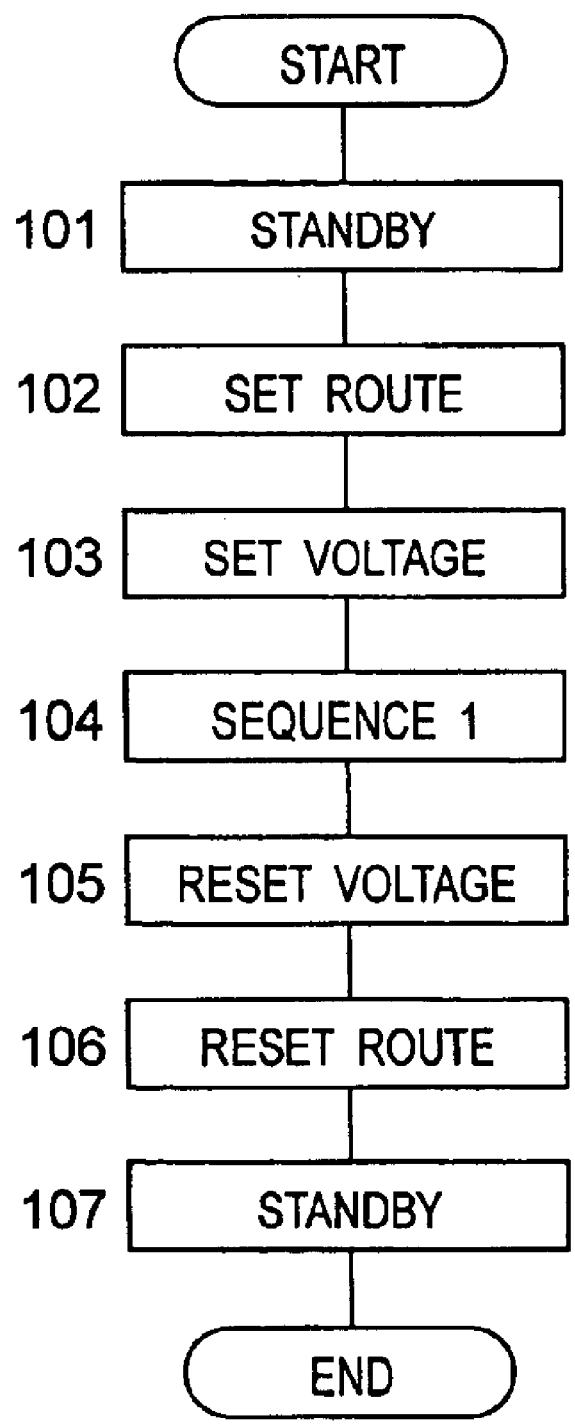
FIG. 2 is a flow chart of sub-sequences constituting a sequence for controlling write and erase operations of the nonvolatile semiconductor memory device according to the first embodiment of the present invention.

A sequence of a program code for write and erase operations stored in the storage unit 3 will be described below. This sequence of the write and erase operations includes a plurality of sub-sequences. FIG. 2 shows an example of the flow chart of the sub-sequence. On the basis of the sub-sequence, the write/erase controller 2 perform the following steps of:

(1) resetting voltages and routes to standby states (101) and starting a sub-sequence;

(2) setting routes (102);

(3) setting voltages (103);

(4) writing or erasing data in/from memory cells according to Sequence 1 (104);

(5) resetting voltages (105);

(6) resetting routes (106); and (7) returning to the standby state (107) to end the sub-sequence.

With respect to the "setting routes" subsequence (2), it is typically noted that positive or negative high voltage is applied to a flash memory in order to perform writing and/or erasing data. Then, overvoltage in excess of allowable voltage may be applied to transistors in the circuit at switching operation according to certain operating sequence or connecting conditions of the transistors, so that the transistors may be destroyed because of failed to withstanding voltage. Therefore, "setting routes" subsequence, on which routes are determined, is provided in order to avoid the transistors destroyed. Then, high voltage can be applied through the routes.

It is noted that the "route" is corresponding to the route of the distributer and address selecting circuit, for example, distributer (14), X-DEC (18), Y-DEC (20), Y-based controller (24), word line and bit line selected according to the address as shown in FIG. 1. However, in this case, high voltage is not applied to the Y-DEC.

In operation, X-DEC (18), Y-DEC (20), Y-based control circuit (24), word line and bit line are determined according to the selected address. It is necessary that certain voltage owing to operations such as writing and erasing should be applied on the drain and source of the memory cell (30, 32). There is a distributer 14 between positive or negative power generator (6, 8) and address selecting circuit, the distributer 14 is also located between WL booster 12 and the address selecting circuit. Then, switching distributer 14 is performed to provide a route for voltage applied so that certain voltage is applied to the selected address according to the operation such as programming (writing) and erasing. Then, the route is set.

According to setting routes, the voltage can be applied though the routes without overvoltage. Subsequently, "setting voltage" subsequence (3) is performed to activate positive and negative power generators (6, 8), WL booster (12), so that voltage is applied to the memory cell and control circuit (18, 24) through the route.

With respect to the "resetting routes" subsequence (6), it is noted that "resetting" causes resetting state corresponding to standby state of each circuit and transistor, at which data are not yet erased, wrote, and read, and any address are not yet selected. The resetting state is also corresponding pre-sequence state at which voltage is applied to the routes in the 0 to Vcc range.

Since high voltage is applied to the routes owing to the set voltage at subsequence (4) for erasing and writing, switching the transistor on the routes causes overvoltage similarly above-mentioned. Therefore, voltage is reduced to not higher than Vcc in order to avoid overvoltage. Subsequently, the switch of the transistor on the routes is set back to pre-sequence state. In fact, the order of subsequences for resetting, e.g. (5) to (7) is inverse order of subsequences for setting, e.g. (1) to (3).

In this nonvolatile semiconductor memory device 1, the sequence stored in the storage unit 3 includes a plurality of sub-sequences. Each of the respective sub-sequences is characterized by including the voltage resetting step 105 of resetting a voltage and a route resetting step 106 of resetting a route. In this manner, the start and end states of the sub-sequences are set to the same standby states. Therefore, the sub-sequences can be independently handled. When the write/erase controller 2 shifts from one sub-sequence to the next sub-sequence, a continuous increase in load on the transistors constituting the memory cells can be suppressed.

The voltages of the transistors can be controlled to be lower than a breakdown voltage. In addition, when a set voltage in the next sub-sequence is lower than the set voltage obtained by the previous sub-sequence, and the write/erase controller 2 directly shifts from the previous sub-sequence to the next sub-sequence, a write or erase operation may be performed in the time required to shift from a high voltage to a low voltage. Since the voltage resetting step 105 and the route resetting step 106 are set in each of the sub-sequences as described above, the write and erase operations and the like can be prevented from being performed in the voltage shift.

Second Embodiment

Figure 3:
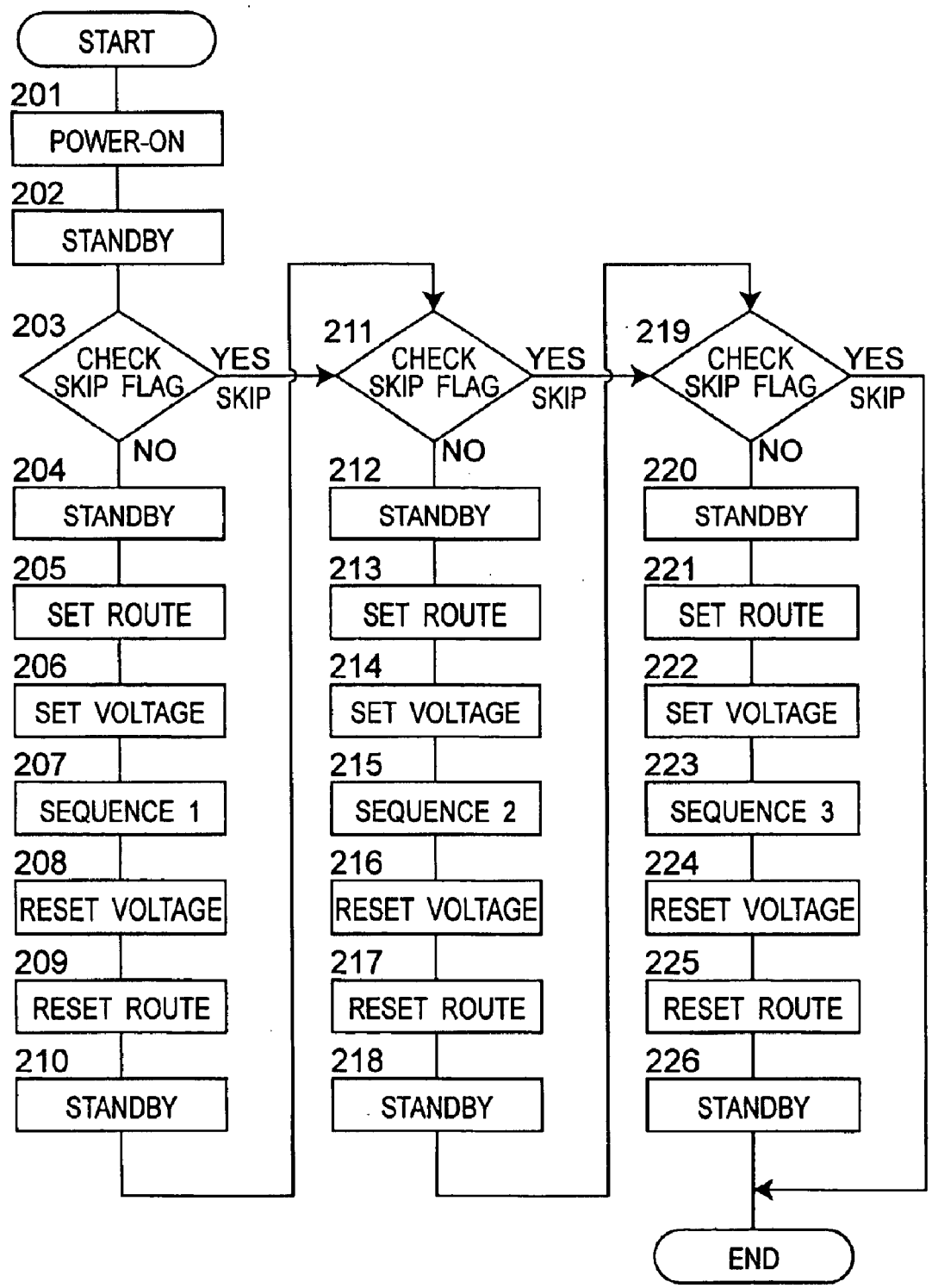
FIG. 3 is a flow chart of a sequence including a plurality of sub-sequences in a nonvolatile semiconductor memory device according to a second embodiment of the present invention.

A nonvolatile semiconductor memory device according to the second embodiment of the present invention will be described below with reference to FIG. 3. FIG. 3 shows an example of a flow chart of a sequence stored in a storage unit 3 of the nonvolatile semiconductor memory device. In this sequence, three sub-sequences, that is, steps 204 to 210, steps 212 to 218, and steps 220 to 226 are continuously arranged. Before the start of each of the sub-sequence, skip flag check steps 203, 211, and 219 are set. In the skip flag check steps 203, 211, and 219, it is checked independently by using flags whether the sub-sequence is skipped or not. In this manner, it can be freely controlled whether each sub-sequence is skipped or not.

FIG. 4 shows a register in which, when the sequence has eight sub-sequences, flags which indicate whether sub-sequences 1 to 8 are independently skipped or not are stored. The flags can be set from the outside. For example, in default, all the flags stored in the register are set to "0". In this case, all the sub-sequences 1 to 8 are executed. Therefore, when the value of the flag corresponding to a specific sub-sequence is changed from "0" to "1", the sub-sequence can be skipped. The register for skip control may be arranged at a part of the storage unit 3, or may be arranged as another storage device.

Third Embodiment

Figure 5:
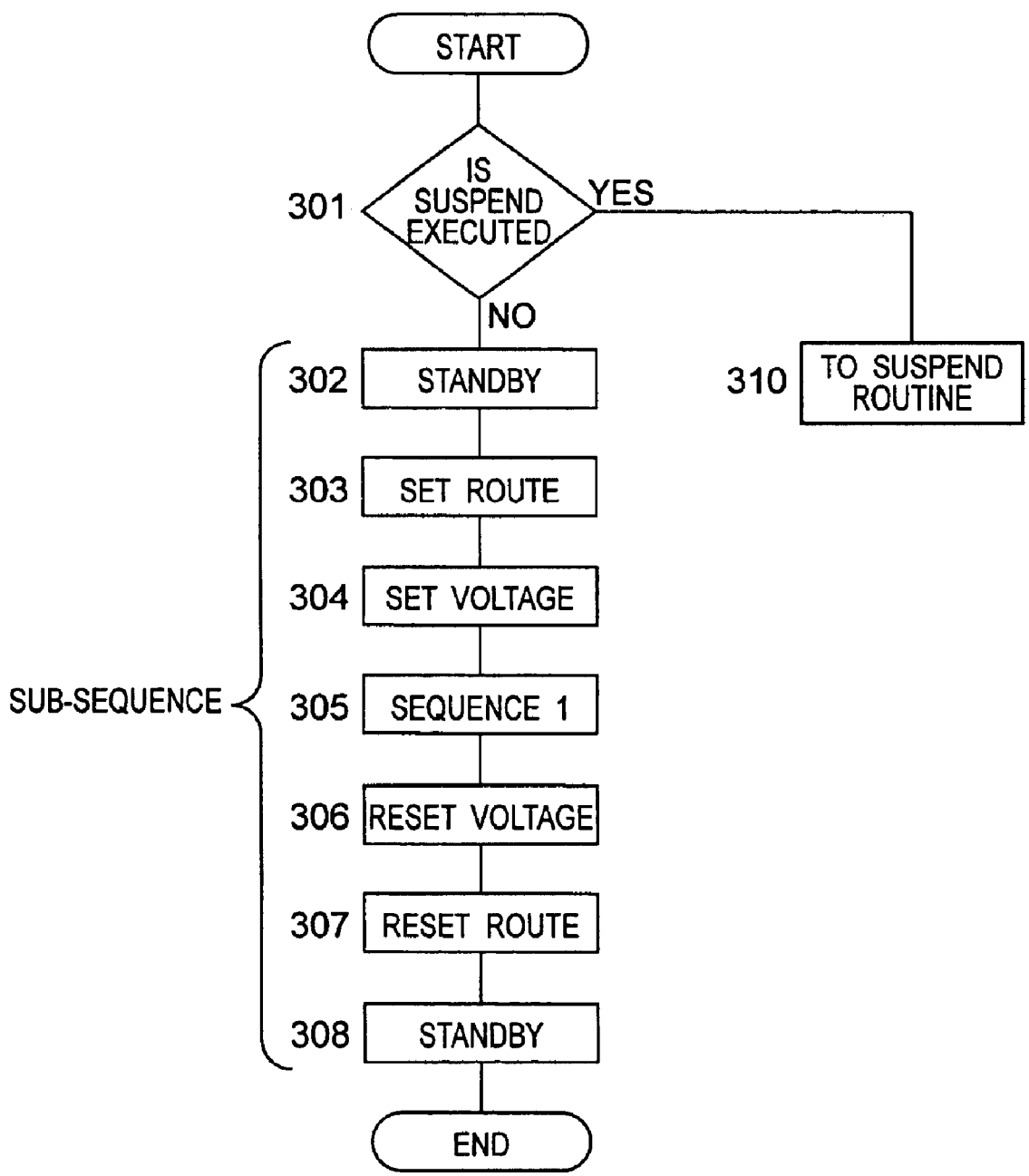
FIG. 5 is a flow chart of a sub-sequence in a nonvolatile semiconductor memory device according to a third embodiment of the present invention.

A nonvolatile semiconductor memory device according to the third embodiment of the present invention will be described below with reference to FIG. 5. FIG. 5 shows a flow chart of a sub-sequence stored in a storage unit of the nonvolatile semiconductor memory device. This sub-sequence includes a step 305 of deciding whether a suspend routine 310 for executing suspend for temporarily interrupting the execution of the sequence is started or not. In this manner, the suspend can be verified with respect to a specific sub-routine.

It may be checked by using a flag stored in advance whether the suspend routine 310 is started or not. The flag may be stored in a register which can be set from the outside.

Fourth Embodiment

Figure 6:
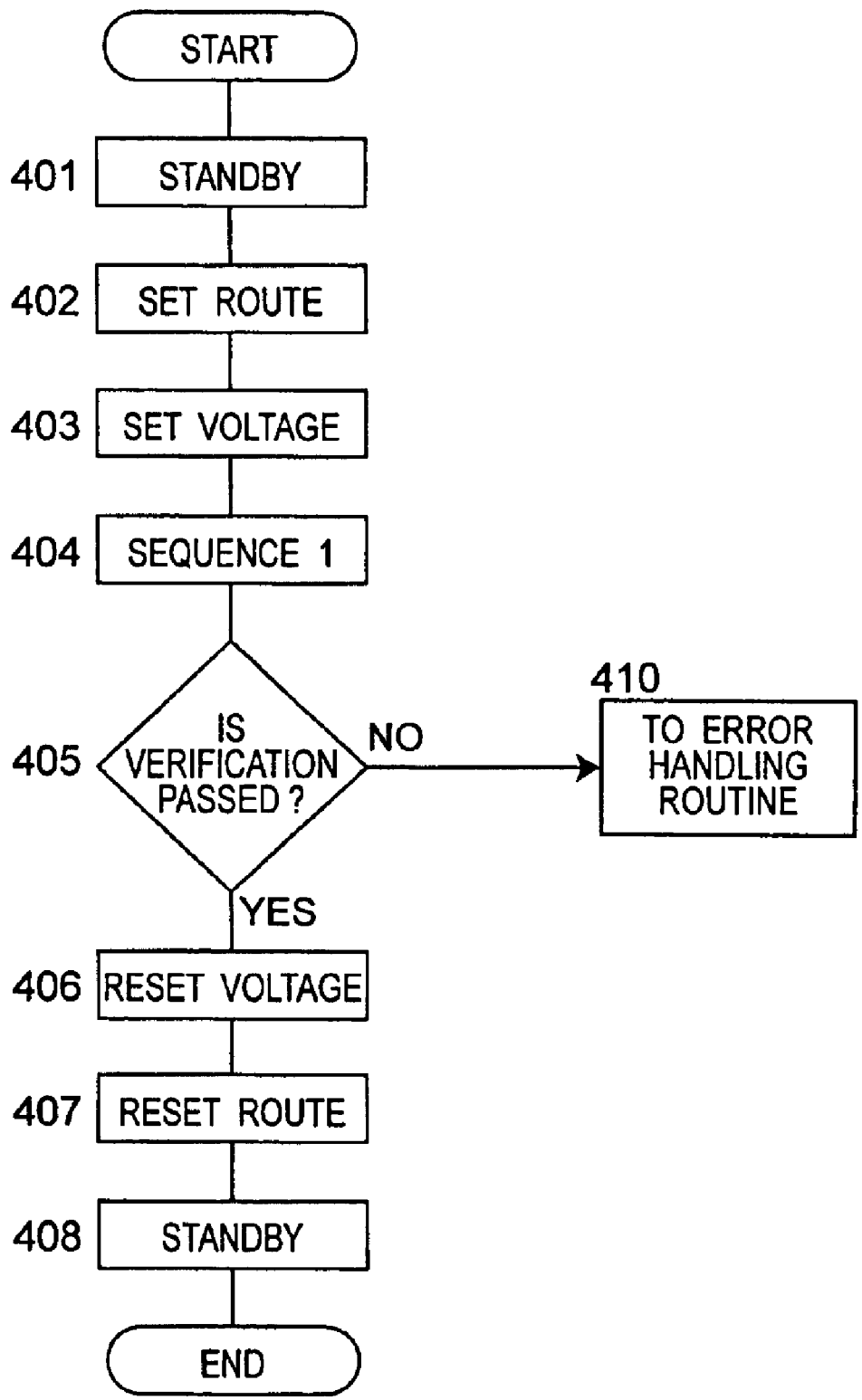
FIG. 6 is a flow chart of a sub-sequence of a nonvolatile semiconductor memory device according to a fourth embodiment of the present invention.

A nonvolatile semiconductor memory device according to the fourth embodiment of the present invention will be described below with reference to FIG. 6. FIG. 6 is a flow chart of a sub-sequence stored in a storage unit 3 of the nonvolatile semiconductor memory device 1. This sub-sequence is characterized by including a step 405 of deciding whether verification is passed or not after a step 404 of Sequence 1 for a write/erase operation is performed. When the verification is passed (Y), following steps 406 to 408 of the sub-sequence are directly executed. In this case, the verify circuit (not shown) is not failed, or the verify circuit is passed. On the other hand, when the verification is executed (N), an error-handling routine 410 is executed to decide levels which the memory cells reach in write and read operations. In this manner, a verify operation can be controlled in a particular sub-sequence.

A flag stored in advance may be used to check whether the verification is passed or not. The flag may be stored in a register which can be set from the outside.

According to the nonvolatile semiconductor memory devices of the embodiments, a sequence stored in a storage unit includes a plurality of sub-sequences. Each of the sub-sequences includes a voltage resetting step of resetting a voltage and a route resetting step of resetting a route before the end of the sub-sequence. In this manner, all the start and end states of the respective sub-sequences are set to the same standby state. Therefore, the sub-sequences can be independently handled.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A nonvolatile semiconductor memory device comprising:

a memory array in which a plurality of memory cells are two-dimensionally arranged;

a selecting circuit which selects one of the memory cell from the memory array;

a storage device in which a sequence for controlling write and erase operations for the memory cells is stored; and a power generator which is able to generate certain voltage higher than requirement voltage for write or erase operation;

a connecting circuit which connects the selecting circuit with the power generator; and a write or erase controller for reading the sequence from the storage unit to control the write and erase operations for the memory cells;

wherein the sequence includes a plurality of sub-sequences in which write or erase operation to the memory cell is implemented;

wherein each of the sub-sequences includes before the end of the sub-sequence:

a voltage resetting step of resetting a voltage impressed on the selecting circuit to the power voltage or grounding; and a route resetting step of resetting a switch of a transistor of the selecting circuit to last status just before write or erase operation.

2. A nonvolatile semiconductor memory device according to claim 1, wherein the sequence has the plurality of sub-sequences which are sequentially arranged, and further includes the skip check step of checking whether the sub-sequences are skipped or not before the start of the sub-sequences.

3. A nonvolatile semiconductor memory device according to claim 2, wherein the skip check step checks whether the sub-sequences are skipped or not by using flags which are stored in the write or erase controller in advance.

4. A nonvolatile semiconductor memory device according to claim 1, wherein the sequence further includes the suspend step of checking whether execution of the sequence is temporarily stopped or not between two adjacent sub-sequences.

5. A nonvolatile semiconductor memory device according to claim 1, wherein the sub-sequence includes the step of checking whether verification for deciding levels which the memory cells reach in a write or erase operation is passed or not.

* * * * *